(12) United States Patent
Djordjevic et al.

(10) Patent No.: US 7,375,983 B2
(45) Date of Patent: May 20, 2008

(54) CIRCUIT BOARD FOR REDUCING CROSSTALK OF SIGNALS

(75) Inventors: Srdjan Djordjevic, München (DE); Wolfgang Hoppe, Bad Tölz (DE)

(73) Assignee: Infineon Technologies AG, Neubiberg (DE)

( * ) Notice: Subject to any disclaimer, the term of this patent is extended or adjusted under 35 U.S.C. 154(b) by 295 days.

(21) Appl. No.: 11/345,626

(22) Filed: Feb. 2, 2006

(65) Prior Publication Data
US 2006/0180917 A1    Aug. 17, 2006

(30) Foreign Application Priority Data
Feb. 3, 2005    (DE) ............... 10 2005 005 063

(51) Int. Cl.
*H05K 9/00* (2006.01)
*H05K 1/11* (2006.01)
(52) U.S. Cl. ............... 361/818; 361/794; 361/792; 361/780; 174/261; 174/255; 333/246
(58) Field of Classification Search ........ 361/790–795, 361/780, 816, 818, 799, 772, 777; 174/255, 174/261, 262, 265, 266; 333/246, 247
See application file for complete search history.

(56) References Cited

U.S. PATENT DOCUMENTS

| 3,876,822 | A | * | 4/1975 | Davy et al. ............... 174/266 |
| 4,812,792 | A | * | 3/1989 | Leibowitz ............... 333/238 |
| 4,954,929 | A | * | 9/1990 | Baran ............... 361/794 |
| 5,488,540 | A | * | 1/1996 | Hatta ............... 361/794 |
| 5,726,863 | A | * | 3/1998 | Nakayama et al. ......... 361/794 |
| 6,181,004 | B1 | | 1/2001 | Koontz et al. |
| 6,353,540 | B1 | * | 3/2002 | Akiba et al. ............... 361/794 |
| 6,418,032 | B2 | * | 7/2002 | Hirata et al. ............... 361/780 |
| 6,753,481 | B2 | * | 6/2004 | Novak ............... 174/255 |
| 6,777,620 | B1 | * | 8/2004 | Abe ............... 174/255 |
| 6,977,820 | B2 | * | 12/2005 | Uchida ............... 361/761 |
| 7,176,383 | B2 | * | 2/2007 | Lauffer et al. ............... 174/255 |
| 7,209,368 | B2 | * | 4/2007 | Lauffer et al. ............... 361/816 |
| 7,239,526 | B1 | * | 7/2007 | Bibee ............... 361/788 |

* cited by examiner

*Primary Examiner*—Tuan T. Dinh
*Assistant Examiner*—Dameon E Levi
(74) *Attorney, Agent, or Firm*—Edell, Shapiro & Finnan, LLC

(57) ABSTRACT

A circuit board includes a first group of layers located close to a top side of the circuit board, and a second group of layers located close to an underside of the circuit board. Signals which are fed to input and output contact terminals on the top side of the circuit board are passed along at least one of the layers of the group. Signals which are fed to input and output contact terminals on the underside of the circuit board are passed along at least one of the layers of the second group. The contact-making holes for connecting the input and output contact terminals to the layers of the first and second groups are preferably formed as blind contact-making holes.

13 Claims, 5 Drawing Sheets

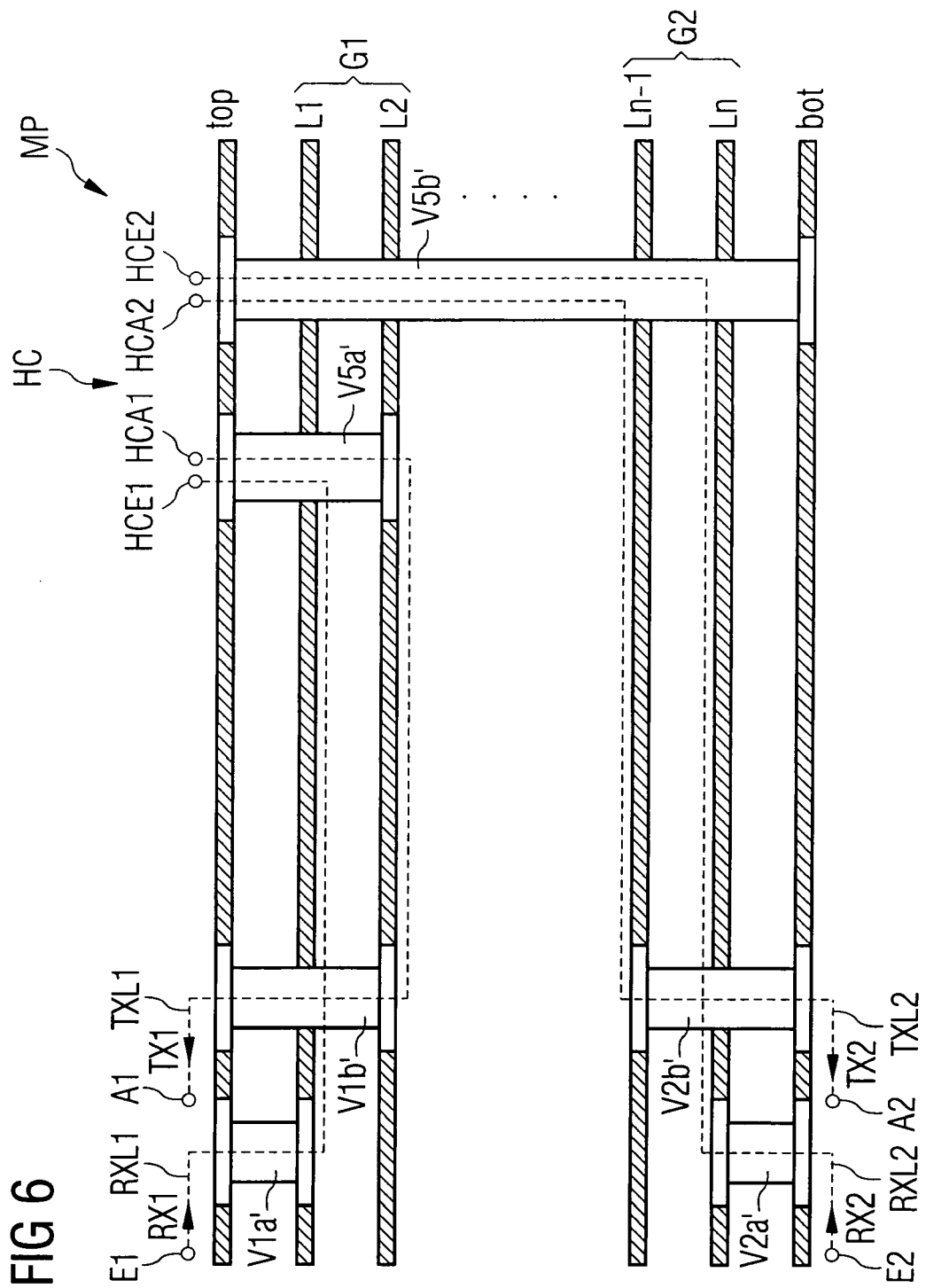

CIRCUIT BOARD FOR REDUCING CROSSTALK OF SIGNALS

CROSS REFERENCE TO RELATED APPLICATIONS

This application claims priority under 35 U.S.C. § 119 to German Application No. DE 10 2005 005063.8, filed on Feb. 3, 2005, and titled "Circuit Board for Reducing Crosstalk of Signals," the entire contents of which are hereby incorporated by reference.

FIELD OF THE INVENTION

The invention relates to a circuit board in which input and output signals are fed to contact terminals on the top side and the underside of the circuit board.

BACKGROUND

In a semiconductor memory module, for example an FBDIMM (fully buffered dual in-line memory module), as set forth in FIG. 1A, semiconductor memory components B are arranged on both sides on a circuit board MP. The semiconductor memory components are driven by a control component SB. The control component and also the semiconductor memory components have a ball grid array housing BGA.

FIG. 1B shows a first surface, for example the top side of an FBDIMM. The control component, which contains a hub chip HC that drives the semiconductor memory components, is arranged in the center of the circuit board MP. The semiconductor memory components are situated on the left-hand and right-hand sides of the hub chip on the circuit board in two rows arranged parallel to one another.

FIG. 1C shows a second surface, for example the underside BOT of the FBDIMM of FIG. 1A. Here, too, the semiconductor memory components are arranged in two rows. Four memory chips ECC equipped with an error correction circuit for correcting memory errors are situated in the center of the underside of the circuit board MP. As on the top side as well, in each case four semiconductor memory components in two rows are arranged on the left-hand and right-hand sides of the four ECC memory chips.

In the case of the planar FBDIMM design illustrated in FIGS. 1A and 1B, precisely one memory chip is situated in each of the semiconductor memory components. The memory chips may contain DRAM (dynamic random access memory) memory cells, by way of example.

FIG. 2 shows a simplified illustration of a detail from a memory cell array SZF that is present on each of the memory chips SP. Within the memory cell array SZF, DRAM memory cells SZ are arranged in matrix-like fashion along word lines WL and bit lines BL. A DRAM memory cell comprises a selection transistor AT and a storage capacitor SC. In order to read out an item of information from the memory cell or in order to write an item of information to the memory cell, the selection transistor AT is switched into the on state by a corresponding control signal on the word line WL. The storage capacitor SC is connected to the bit line BL in low-resistance fashion. Consequently, via the bit line BL, the charge state of the storage capacitor can be read out in the case of a read access or a charge state can be stored in the storage capacitor in the case of a write access.

In order to carry out read and write accesses to the memory cells of the memory chip, the hub chip HC is driven by a memory controller. The control signals of the memory controller are fed to the FBDIMM memory module via a first and second bus. For this purpose, the first bus is connected to input and output contact terminals E1 and A1 on the top side TOP of the circuit board MP. The second bus is connected to input and output contact terminals E2 and A2 on the underside BOT of the circuit board MP. Each of the two buses can transmit control signals to the hub chip and also receive them from the hub chip.

If, in contrast to the planar FBDIMM design illustrated in FIGS. 1A and 1B, a so-called "stacked" FBDIMM memory module design is used, then in each case two memory chips (dual stacked) or four memory chips (quad stacked) are arranged in stacked fashion within the semiconductor memory components. In this embodiment, only one respective row having semiconductor components is situated on the top side and the underside of the semiconductor memory module. In the case of such a "stacked" memory module design, in accordance with a standardization, the signals fed to the input contact terminals E1 are fed to the hub chip HC via conductor tracks running on the surface TOP of the circuit board MP. Correspondingly, the signals fed from the hub chip to the output terminals A1 on the top side TOP are also fed via conductor tracks running on the top side of the circuit board MP.

By contrast, the input signals which are fed to the input contact terminals E2 on the underside BOT of the circuit board are fed via short conductor tracks on the underside of the circuit board to a contact hole (plated through hole) running through the circuit board. Via the plated through hole, the input contact terminals E2 are connected to conductor tracks running on an inner layer of the multilayer circuit board MP. The conductor tracks are led through a further plated through hole in the region of the hub chip to the top side TOP of the circuit board, from where they are led to the hub chip via a short conductor segment on the top side of the circuit board.

The signals which are fed from the hub chip to the output terminals A2 on the underside BOT of the circuit board are likewise fed to a further plated through hole via a short conductor segment on the top side of the circuit board. They are passed through the further plated through hole as far as an inner layer of the circuit board and then run via a conductor track on the inner layer of the circuit board as far as a further plated through hole, through which they emerge again on the underside BOT of the circuit board, from where they are fed to the output contact terminals A2 via a short conductor segment on the underside of the circuit board.

Such feeding of signals from the memory controller to the hub chip and from the hub chip to the memory controller is not possible, however, in the case of an FBDIMM in the planar design. FIG. 3 shows a detail from the top side TOP of the FBDIMM of FIG. 1B. The illustration shows the hub chip HC and the memory chips SP arranged in two rows on the left-hand side of the hub chip. Furthermore, arranged at the edge of the memory card are the input contact terminals E1 and the output contact terminals A1, to which the first bus is connected, which connects the FBDIMM memory module to the memory controller.

On account of the small space available, only some of the conductor tracks RXL1 leading from the input contact terminals E1 to the hub chip HC and only some of the conductor tracks TXL1 leading back from the hub chip HC to the output contact terminals A1 can run on the top side TOP of the circuit board. The remaining input and output contact terminals are led to the hub chip, and are led from the hub chip again to the output contact terminals, via conductor tracks running on inner layers of the multilayer circuit board MP. For this purpose, the input and output contact terminals are connected via short conductor segments to plated through holes extending from the top side TOP as far as the underside BOT of the circuit board. Via these plated through holes, the input and output contact terminals are connected to the conductor tracks internally in the circuit board. Situated in the region of the hub chip are further plated through holes, through which the conductor tracks are led from the inner layers to the surface TOP again, from where they are led directly to the hub chip.

FIG. 4 shows a cross section through the multilevel circuit board (multilayer circuit board) MP. The circuit board has a top side TOP and an underside BOT, between which a plurality of inner layers are arranged one above another. A layer L1 and L2 belong to a group G1 of layers which are arranged close to the top side TOP of the circuit board. A layer Ln−1 and Ln belong to a group G2 of layers which are arranged close to an underside BOT of the circuit board.

The circuit board MP has two continuous contact-making holes V1a and V1b in the region of an input contact terminal E1 and an output contact terminal A1 on the top side TOP of the circuit board, the contact-making holes extending from the top side TOP of the circuit board to the underside BOT of the circuit board. Two further continuous contact-making holes V2a and V2b are arranged in the region of an input contact terminal E2 and an output contact terminal A2 on the underside of the circuit board, the contact-making holes likewise extending from the top side TOP to the underside BOT of the circuit board. Alongside the continuous contact-making holes in the region of the input and output contact terminals, two further continuous contact-making holes V5a and V5b also exist, which likewise extend from the top side TOP to the underside BOT of the circuit board. The hub chip HC is arranged in the region of these two continuous contact-making holes.

An input signal RX1 fed from the memory controller via the first bus is applied to the input contact terminal E1 on the top side TOP of the circuit board. The input signal RX1 is fed via a conductor track RXL1 to an input terminal HCE1 of the hub chip HC. The conductor track RXL1 runs from the input contact terminal E1 via a short conductor segment on the top side of the circuit board as far as the continuous contact-making hole V1a and then runs within the continuous contact-making hole V1a as far as the layer L1. The conductor track RXL1 is then led along the layer L1 and led to the continuous contact-making hole V5a through which it passes to the top side TOP of the circuit board to the input terminal HCE1 of the hub chip. A conductor track RXL2, which connects the input contact terminal E2 on the underside of the circuit board to the input terminal HCE2 of the hub chip, likewise runs in the region of the layer L1. An input signal RX2, which is fed to the input contact terminal E2 from the memory controller via the second bus, is present at the input contact terminal E2 on the underside BOT of the circuit board. Consequently, only lines carrying input signals RX1 and RX2 that pass from the memory controller to the hub chip run on the layer plane L1.

At an output terminal HCA1, the hub chip generates an output signal TX1, which is fed via a conductor track TXL1 to the output contact terminal A1 on the top side TOP of the circuit board. The conductor track TXL1 runs through the continuous contact-making hole V5b as far as the layer plane Ln, on which the conductor track TXL1 is led as far as the continuous contact-making hole V1b. The conductor track TXL1 is led through the continuous contact-making hole V1b to the top side TOP of the circuit board again, and is led from there to the output contact terminal A1. The output contact terminal A1 is connected to the first bus, via which the output signal TX1 is fed to the memory controller. The first bus is thus formed as a bidirectional bus.

A further output terminal HCA2 of the hub chip is connected via a conductor track TXL2 to the output contact terminal A2 on the underside BOT of the circuit board. The conductor track TXL2 is led from the output terminal HCA2 of the hub chip through the continuous contact-making hole V5b likewise as far as the layer plane Ln, along which the conductor track TXL2 is led further as far as the continuous contact-making hole V2b. The conductor track TXL2 is led through the continuous contact-making hole V2b to the underside BOT of the circuit board. The output signal TX2 passes via a short conductor segment to the output contact terminal A2, which is connected to the second bus for transmitting the output signal TX2 from the hub chip to the memory controller. The output signals TX1 and TX2 from the hub chip to the memory controller thus run via conductor tracks on the inner layer Ln of the circuit board. The second bus is formed as a bidirectional bus since it transmits both input signals RX2 and output signals TX2 between the hub chip and the memory controller.

A "routing" of conductor tracks as shown in FIG. 4 results in a high degree of signal crosstalk, however, which is additionally intensified by using continuous contact-making holes, which represent a high inductance. However, the essential cause of the crosstalk is due to the fact that the signals which are sent from the memory controller to the hub chip are transmitted via conductor tracks in a layer plane that is arranged close to the top side TOP of the circuit board, and all the signals which are sent from the hub chip to the memory controller run on conductor tracks in a layer plane that is arranged close to the underside BOT of the circuit board. In particular, one problem is that the input signal RX2, when passing through the contact-making hole V2a, has to cross a plurality of reference planes internally within the circuit board before it passes from the underside BOT to the layer plane L1. Likewise, the output signal TX1 has to cross a plurality of reference planes internally within the circuit board via the continuous contact-making hole V5b before it reaches the layer plane Ln.

SUMMARY OF THE INVENTION

The present invention provides a circuit board in which crosstalk between signals that run on layers within the circuit board is reduced.

In accordance with the present invention, a circuit board is provided that includes a first surface and a second surface. The circuit board comprises a plurality of layers in a stacked arrangement one above another between the first surface and the second surface, where a first group of the layers is located closer to the first surface of the circuit board and a second group of the layers is located closer to the second surface of the circuit board. A semiconductor control component is arranged on the first surface of the circuit board. The circuit board furthermore comprises at least two first contact terminals arranged on the first surface of the circuit board, one of the two first contact terminals being used to apply a first input signal and the other of the two first contact terminals being used to generate a first output signal.

The circuit board furthermore comprises at least two second contact terminals arranged on the second surface of the circuit board, one of the two second contact terminals being used to apply a second input signal and the other of the two second contact terminals being used to generate a second output signal. The circuit board furthermore comprises two first conductor tracks, one of the two first conductor tracks being used to transmit the first input signal from the one of the two first contact terminals to the semiconductor control component and the other of the two first conductor tracks being used to transmit the first output signal from the semiconductor control component to the other of the two first contact terminals.

The circuit board furthermore comprises two second conductor tracks, one of the two second conductor tracks being used to transmit the second input signal from the one of the two second contact terminals to the semiconductor control component and the other of the two second conductor tracks being used to transmit the second output signal from the semiconductor control component to the other of the two second contact terminals. The two first conductor tracks run in at least one of the layers of the first group of the layers, whereas the two second conductor tracks run in at least one of the layers of the second group of the layers.

The routing method according to the invention significantly reduces the crosstalk between signals. In particular, the routing technique is independent of the number of layers of the multilevel circuit board. It can be applied both to "single-ended" signals and to differential signals.

In accordance with one embodiment of the circuit board of the invention, the layers of the first group comprise a first layer and at least one second layer, the first layer of the first group lying closer to the first surface of the circuit board than the second layer of the first group. The layers of the second group comprise a first layer and at least one second layer, the first layer of the second group lying closer to the second surface of the circuit board than the second layer of the second group. The two first conductor tracks run in the first layer of the first group and the two second conductor tracks run in the second layer of the second group.

In accordance with a further embodiment of the circuit board according to the invention, first and second continuous contact-making hole are provided, which in each case extend from the first surface to the second surface of the circuit board. The first conductor tracks run from the first contact terminals through the first continuous contact-making hole as far as the first layer of the first group. The second conductor tracks run from the second contact terminals through the second continuous contact-making hole to the first layer of the second group.

The circuit board according to the invention preferably comprises a first blind contact-making hole extending from the first surface of the circuit board as far as the first layer of the first group. A second blind contact-making hole is further provided which extends from the second surface of the circuit board as far as the first layer of the second group. The first conductor tracks run from the first contact terminals through the first blind contact-making hole to the first layer of the first group. The second conductor tracks run from the second contact terminals through the second blind contact-making hole to the first layer of the second group.

According to a further embodiment of the circuit board of the invention, a first portion of the first conductor tracks runs in the first layer of the first group. A second portion of the first conductor tracks runs in the second layer of the first group. A first portion of the second conductor tracks runs in the first layer of the second group. A second portion of the second conductor tracks runs in the second layer of the second group.

In yet another embodiment of the circuit board of the invention, first, second, third and fourth continuous contact-making holes are provided, where each contact-making hole extends from the first surface to the second surface of the circuit board. The first portion of the first conductor tracks runs from the first contact terminals through the first continuous contact-making hole as far as the first layer of the first group. The second portion of the second conductor tracks runs from the second contact terminals through the second continuous contact-making hole to the first layer of the second group. The second portion of the first conductor tracks runs from the first contact terminals through the third continuous contact-making hole as far as the second layer of the first group. The second portion of the second conductor tracks runs from the second contact terminals through the fourth continuous contact-making hole as far as the second layer of the second group.

Another embodiment of the circuit board according to the invention includes a first blind contact-making hole extending from the first surface of the circuit board as far as the first layer of the first group. A second blind contact-making hole extends from the second surface of the circuit board as far as the first layer of the second group. A third blind contact-making hole extends from the first surface of the circuit board as far as the second layer of the first group. A fourth blind contact-making hole extends from the second surface of the circuit board as far as the second layer of the second group. The first portion of the first conductor tracks runs from the first contact terminals through the first blind contact-making hole as far as the first layer of the first group. The first portion of the second conductor tracks runs from the second contact terminals through the second blind contact-making hole as far as the first layer of the second group. The second portion of the first conductor tracks runs from the first contact terminals in the third blind contact-making hole as far as the second layer of the first group. The second portion of the second conductor tracks runs from the second contact terminals through the fourth blind contact-making hole as far as the second layer of the second group.

The circuit board of the invention can further include a fifth blind contact-making hole extending from one of the layers of the first group to the first surface of the circuit board. In addition, a fifth continuous contact-making hole can be provided which extends from the first surface to the second surface of the circuit board. The first conductor tracks run from the one of the layers of the first group through the fifth blind contact-making hole as far as the semiconductor control component. The second conductor tracks run from the one of the layers of the second group through the fifth continuous contact-making hole to the semiconductor control component.

Semiconductor memory components are preferably arranged on the circuit board. The semiconductor control component controls the carrying out of read and write accesses to the semiconductor memory components.

In accordance with a further embodiment of the circuit board, the semiconductor memory components each contain a memory chip including dynamic random access memory cells.

The semiconductor control component is preferably formed as a hub chip.

The hub chip of the semiconductor control component is preferably situated in a ball grid array housing.

The circuit board according to the invention is preferably formed as a fully buffered dual in-line memory circuit board.

The above and still further objects, features and advantages of the present invention will become apparent upon consideration of the following detailed description of specific embodiments thereof, particularly when taken in con-

BRIEF DESCRIPTION OF THE DRAWINGS

FIG. 6 depicts a cross-sectional view of a routing of conductor tracks on inner layers of a circuit board of an FBDIMM in accordance with a second embodiment of the invention.

DETAILED DESCRIPTION

Figure 1A:
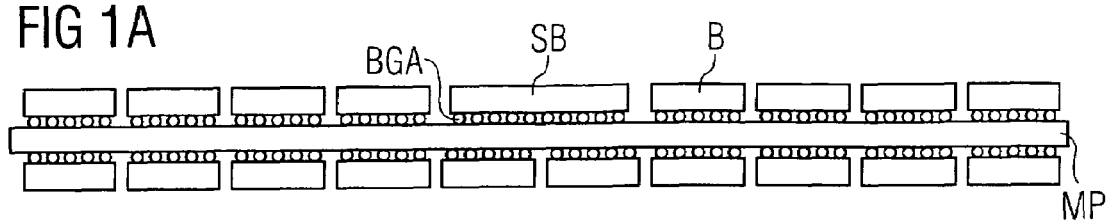
FIG. 1A depicts a cross-sectional view through an FBDIMM.
Figure 1B:
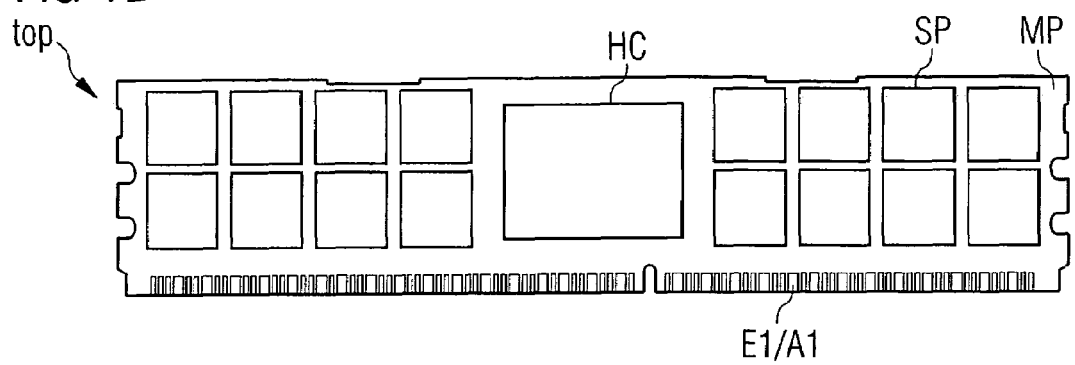
FIG. 1B depicts a top side in plan view of the FBDIMM of FIG. 1A.
Figure 1C:
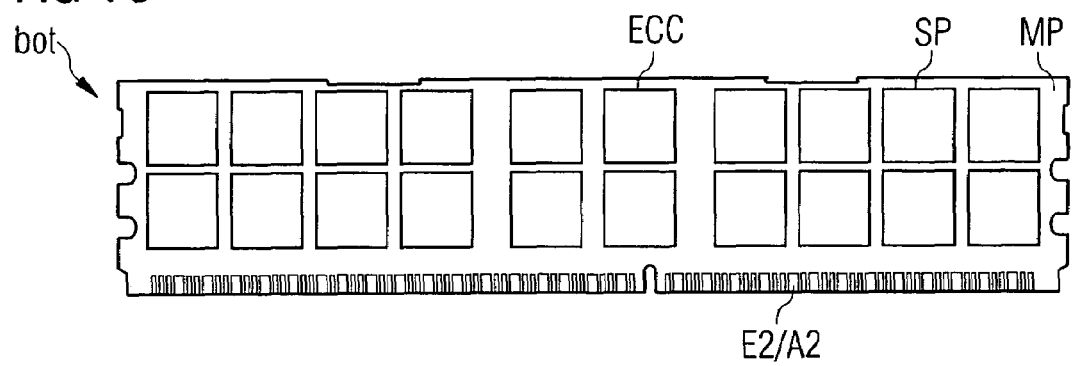
FIG. 1C depicts an underside in plan view of the FBDIMM of FIG. 1A.
Figure 2:
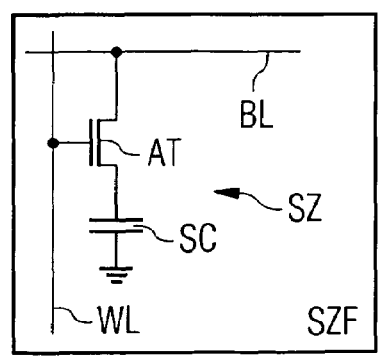
FIG. 2 depicts a memory cell array of FBDIMM.
Figure 3:
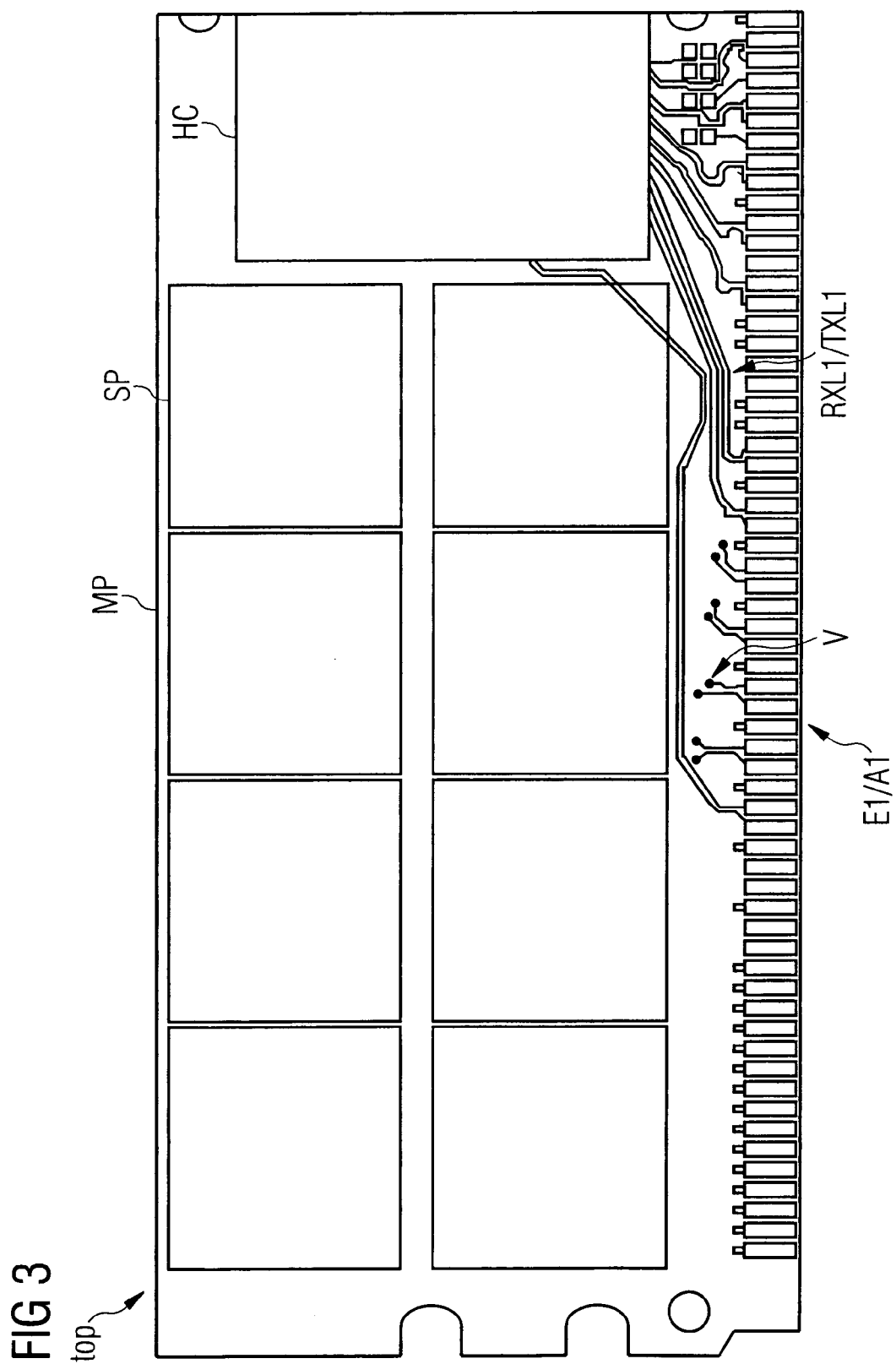
FIG. 3 depicts a detailed plan view from the underside of a circuit board of an FBDIMM in planar design.
Figure 4:
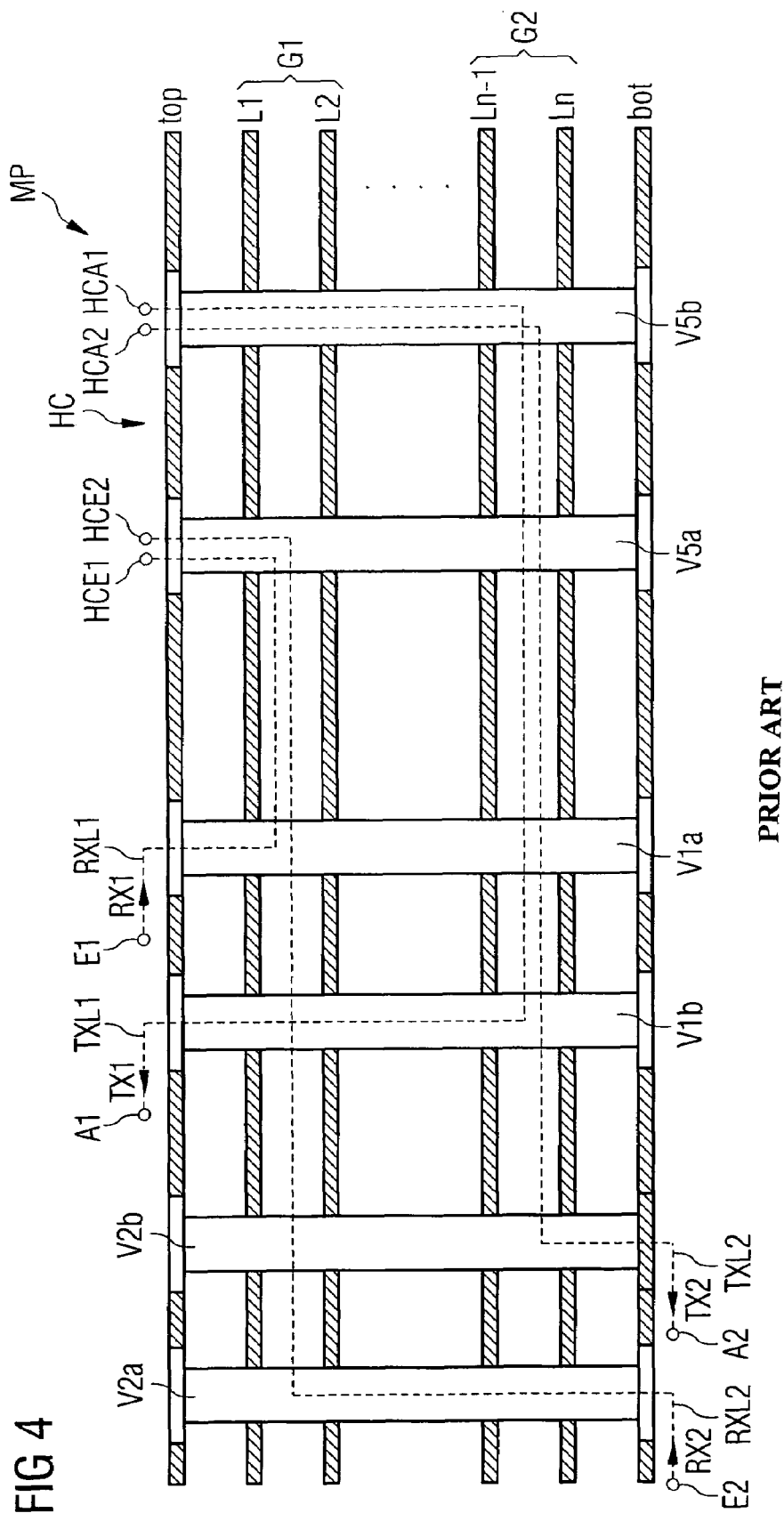
FIG. 4 depicts a cross-sectional view showing routing of conductor tracks on inner layers of a circuit board of an FBDIMM in accordance with the prior art.
Figure 5:
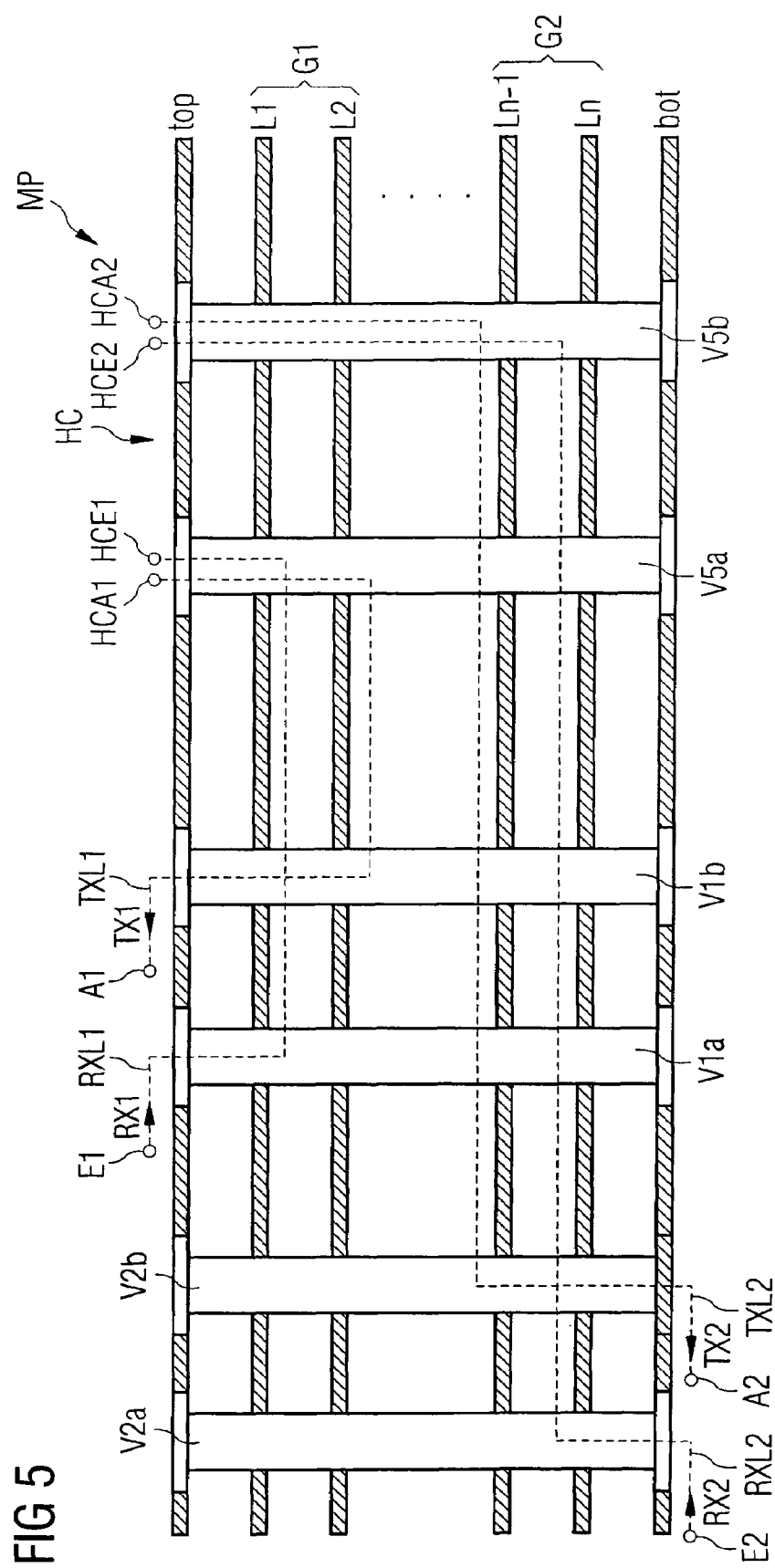
FIG. 5 depicts a cross-sectional view of a routing of conductor tracks on inner layers of a circuit board of an FBDIMM in accordance with a first embodiment of the present invention.

A multilevel circuit board MP is shown in FIG. 5 including a top side TOP and underside BOT. A plurality of inner layer planes L1, L2, . . . , Ln−1, Ln are arranged between the top side and the underside. In this case, the layer planes L1 and L2 belong to a group G1 of layer planes which are arranged close to the top side TOP of the circuit board, and the layer planes Ln−1 and Ln belong to a group G2 arranged close to the underside BOT of the circuit board. In the region of the input and output contact terminals, the circuit board includes four continuous contact-making holes V1a, V1b, V2a and V2b extending from the top side TOP to the underside BOT of the circuit board. Two continuous contact-making holes V5a and V5b likewise extending from the surface TOP as far as the underside BOT of the circuit board are present in the region of the hub chip HC.

According to the invention, all of the conductor tracks carrying signals that are fed to contact terminals on the top side of the circuit board run on at least one layer plane of the group G1. This is irrespective of whether the signals are input signals which are transmitted from the memory controller to the hub chip, or whether they are output signals which are transmitted from the hub chip to the memory controller. Likewise, all signals fed to contact terminals on the underside BOT of the circuit board are transmitted on inner layer planes of the group G2. In this case, too, this is irrespective of whether the signals are input signals which pass from the memory controller to the hub chip, or whether they are output signals which are transmitted from the hub chip to the memory controller.

The input signals RX1 fed to the FBDIMM at the input contact terminal E1 are fed to the inner layer L1 via the continuous contact-making hole V1a and run via the conductor track RXL1 on the layer L1 as far as the continuous contact-making hole V5a, through which they pass to the top side TOP of the circuit board to the input terminal HCE1 of the hub chip. The signals TX1 generated at the output contact terminal A1 are passed from an output terminal HCA1 of the hub chip via a conductor track TXL1 led through the continuous contact-making hole V5a as far as the layer plane L2, past along the layer plane L2 as far as the continuous contact-making hole V1b, and from there fed via the continuous contact-making hole V1b to the output contact terminal A1 on the top side of the circuit board.

The input contact terminal E2 arranged on the underside of the circuit board is connected to the input terminal HCE2 of the hub chip via a conductor track RXL2. In particular, the conductor track RXL2 runs through the continuous contact-making hole V2a as far as the inner layer Ln, along the inner layer Ln as far as the continuous contact-making hole V5b and from there as far as the input terminal HCE2 of the hub chip on the top side TOP of the circuit board.

The output signal TX2 runs via a conductor track TXL2 from the output terminal HCA2 on the top side of the circuit board through the continuous contact-making hole V5b as far as the inner layer Ln−1, along the inner layer Ln−1 as far as the continuous contact-making hole V2b and from there to the output contact terminal A2 on the underside BOT of the circuit board.

Preferably, all the conductor tracks which run between the input and output terminals HCE1 and HCA1 of the hub chip and the input and output contact terminals E1 and A1 on the top side of the circuit board are led along one of the inner layers of the group G1 which lies closest to the surface TOP. In the example of FIG. 5, therefore, preferably all of the conductor tracks RXL1 and TXL1 are led along the inner layer L1 of the group G1. Likewise, all of the conductor tracks RXL2 and TXL2 which run between the input terminal HCE2 and the output terminal HCA2 of the hub chip and the input and output contact terminals E2 and A2, respectively, on the underside of the circuit board are led on that inner layer of the group G2 which lies closest to the underside BOT. In the example of FIG. 5, therefore, preferably the conductor tracks RXL2 and TXL2 are led along the layer Ln.

A routing of all the conductor tracks which are connected to the input and output contact terminals E1 and A1 on the top side of the circuit board via a common layer, for example the layer L1, and a routing of all the conductor tracks which are connected to the input and output contact terminals E2 and A2 on the underside of the circuit board via common layer, for example the layer Ln, is impossible in most cases, however, for space reasons. Therefore, a portion of the conductor tracks RXL1 and TXL1 which are connected to the input and output contact terminals E1 and A1 on the top side of the circuit board is led along the layer L1 and a second portion of the conductor tracks is led on the next underlying layer L2. Likewise, a portion of the conductor tracks RXL2 and TXL2 which are connected to the input and output contact terminals E2 and A2 on the underside of the circuit board is led on the layer Ln and a further portion of the conductor tracks is led on the next more remote layer Ln−1.

For the sake of clarity, the input signals RX1 depicted in FIG. 5 are passed along the layer L1 and the output signals TXL1 are passed along the layer L2. Such a separation of input and output signals is not absolutely necessary, however. In other words, both input and output signals which are fed to the input and output contact terminals on the top side of the circuit board can run both along the layer L1 and along the layer L2 in accordance with the invention. Likewise, the apportioning of the input and output signals RX2 to the layer Ln and TX2 to the layer Ln−1 as illustrated in FIG. 5 is not absolutely necessary. Both input and output signals which are connected to the input and output contact terminals on the underside of the circuit board can be passed jointly both on the layer Ln and on the layer Ln−1.

FIG. 6 shows another embodiment of a routing of conductor tracks between the hub chip and the memory controller in accordance with the invention. In contrast to the embodiment of FIG. 5, blind contact-making holes are preferably used in this embodiment. Thus, in the region of the input and output contact terminals, the blind contact-making hole V1a' connects the top side TOP of the circuit board to the inner layer L1, the blind contact-making hole V1b' connects the top side TOP of the circuit board to the inner layer L2, the blind contact-making hole V2a' connects the underside BOT to the layer Ln, the blind contact-making hole V2b' connects the underside BOT to the layer Ln−1, and the blind contact-making hole V5a' in the region of the hub chip connects the layer plane L2 to the top side TOP of the circuit board.

The conductor track RXL1 runs from the input contact terminal E1 on the top side of the circuit board through the blind contact-making hole V1a' as far as the layer L1, along the layer L1 as far as the blind contact-making hole V5a' and from there as far as the input terminal HCE1 of the hub chip. The conductor track TXL1 runs from the output terminal HCA1 of the hub chip through the blind contact-making hole V5a' as far as the inner layer L2, subsequently along the inner layer L2 as far as the blind contact-making hole V1b' and from there to the output contact terminal A1 on the top side of the circuit board. The input contact terminal E2 on the underside of the circuit board is connected to the input terminal HCE2 of the hub chip via the conductor track RXL2 which is led through the blind contact-making hole V2a' as far as the layer plane Ln and subsequently runs along the layer plane Ln as far as the continuous contact-making hole V5b' and then through the continuous contact-making hole V5b' as far as the input terminal HCE2 of the hub chip. The conductor track TXL2, which connects the output terminal HCA2 of the hub chip to the output contact terminal A2 on the underside of the circuit board, is led through the continuous contact-making hole V5b' as far as the layer Ln−1, from there is led along the layer Ln−1 as far as the blind contact-making hole V2b' and from there is led to the output contact terminal A2 on the underside of the circuit board.

In a similar manner as the embodiment of FIG. 5, all of the conductor tracks which are connected to the input and output contact terminals E1 and A1 on the top side of the circuit board of FIG. 6 are preferably intended to run along that inner layer of the group G1 which lies closest to the top side TOP of the circuit board. Correspondingly, all the conductor tracks which are connected to the input and output contact terminals E2 and A2 on the underside of the circuit board are intended to be led along that inner layer of the group G2 which lies closest to the underside BOT of the circuit board.

Since the available space on the layer L1 and on the layer Ln is limited in the example of FIG. 6, a portion of the conductor tracks which are connected to the input and output contact terminals E1 and A1 on the top side of the circuit board is led along the layer L1 and another portion of the conductor tracks is led along the layer L2, which, after the layer L1, is the next closest to the top side. Likewise, one portion of the conductor tracks which are connected to the input and output contact terminals E2 and A2 on the underside of the circuit board is led along the layer Ln closest to the underside of the circuit board, and a further portion is led on the layer Ln−1, which, after the layer Ln, is the next closest to the underside.

As noted in the embodiment of FIG. 5, it is not absolutely necessary in the embodiment of FIG. 6 for input signals RX to be passed along one of the two layers and output signals TX to be passed on the next underlying or overlying layer. Instead, each of the layers L1 and L2 and also each of the layers Ln and Ln−1 may carry both input and output signals.

By using the technique of routing conductor tracks as set forth in FIGS. 5 and 6, it is possible to considerably reduce the crosstalk between the individual conductor tracks. A further improvement of the crosstalk is obtained by using the blind contact-making holes provided in FIG. 6. Through the use of blind contact-making holes, in particular preferably the use of short blind contact-making holes, such as, for example, the use of the contact-making holes V1a' and V2a', it is possible to significantly reduce the inductance in the region of the contact-making holes. The consequence is an improved signal integrity, and also a reduction of the crosstalk. Furthermore, by routing conductor tracks in accordance with the invention, it is possible to significantly reduce reflections of signals and to improve the intersymbol interference.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
| --- | --- |
| MP | Circuit board |
| SP | Memory chip |
| HC | Hub chip |
| E | Input contact terminal |
| A | Output contact terminal |
| TOP | Top side |
| BOT | Underside |
| ECC | Error correction memory chip |
| SZF | Memory cell array |
| SZ | Memory cell |
| BL | Bit line |
| WL | Word line |
| AT | Selection transistor |
| SC | Storage capacitor |
| RXL, TXL | Conductor tracks |
| HCE, HCA | Input and output terminals of the hub chip |
| L | Layer planes |
| V | Continuous contact-making holes |
| V' | Blind contact-making holes |

What is claimed:

1. A circuit board for reducing crosstalk of signals, the circuit board comprising:
a first surface and a second surface;
a plurality of layers aligned with respect to each other in a stacked arrangement between the first surface and the second surface, wherein a first group of the layers is located closer to the first surface than the second surface of the circuit board and a second group of the layers is located closer to the second surface than the first surface of the circuit board;
a semiconductor control component arranged on the first surface of the circuit board;
a pair of first contact terminals arranged on the first surface of the circuit board, wherein one of the first contact terminals is configured to apply a first input signal and the other of the first contact terminals is configured to generate a first output signal;
a pair of second contact terminals arranged on the second surface of the circuit board, wherein one of the second contact terminals is configured to apply a second input signal and the other of the second contact terminals is configured to generate a second output signal;
a pair of first conductor tracks, wherein one of the first conductor tracks is configured to transmit the first input signal from the one of the first contact terminals to the semiconductor control component and the other of the first conductor tracks is configured to transmit the first output signal from the semiconductor control component to the other of the first contact terminals;
a pair of second conductor tracks, wherein one of the second conductor tracks is configured to transmit the second input signal from the one of the second contact terminals to the semiconductor control component and the other of the second conductor tracks is configured to transmit the second output signal from the semiconductor control component to the other of the second contact terminals;
wherein the first conductor tracks run within at least one of the layers of the first group of the layers, and the second conductor tracks run within at least one of the layers of the second group of the layers.

2. The circuit board of claim 1, wherein:
the layers of the first group comprise a first layer and a second layer, the first layer of the first group is located closer to the first surface of the circuit board than the second layer of the first group; and
the layers of the second group comprise a first layer and a second layer, the first layer of the second group is located closer to the second surface of the circuit board than the second layer of the second group; and
at least one of the first conductor tracks runs within the first layer of the first group, and at least one of the second conductor tracks runs within the second layer of the second group.

3. The circuit board of claim 2, further comprising:
a first continuous contact-making hole and a second continuous contact-making hole, wherein each contact-making hole extends from the first surface to the second surface of the circuit board;
wherein at least one of the first conductor tracks runs from the first contact terminals through the first continuous contact-making hole to the first layer of the first group, and at least one of the second conductor tracks runs from the second contact terminals through the second continuous contact-making hole to the first layer of the second group.

4. The circuit board of claim 2, further comprising:
a first blind contact-making hole extending from the first surface of the circuit board to the first layer of the first group; and
a second blind contact-making hole extending from the second surface of the circuit board to the first layer of the second group;
wherein at least one of the first conductor tracks runs from the first contact terminals through the first blind contact-making hole to the first layer of the first group, and at least one of the second conductor tracks runs from the second contact terminals through the second blind contact-making hole to the first layer of the second group.

5. The circuit board of claim 2, wherein:
the one of the first conductor tracks runs within the first layer of the first group;
the other of the first conductor tracks runs within the second layer of the first group;
the one of the second conductor tracks runs within the first layer of the second group; and
the other of the second conductor tracks runs within the second layer of the second group.

6. The circuit board of claim 5, further comprising:
first, second, third and fourth continuous contact-making holes, each continuous contact-making hole extending from the first surface to the second surface of the circuit board;
wherein:
the one of the first conductor tracks runs from the one of the first contact terminals through the first continuous contact-making hole to the first layer of the first group, and the one of the second conductor tracks runs from the one of the second contact terminals through the second continuous contact-making hole to the first layer of the second group; and
the other of the first conductor tracks runs from the other of the first contact terminals through the third continuous contact-making hole to the second layer of the first group, and the other of the second conductor tracks runs from the other of the second contact terminals through the fourth continuous contact-making hole to the second layer of the second group.

7. The circuit board of claim 5, further comprising:
a first blind contact-making hole extending from the first surface of the circuit board to the first layer of the first group;
a second blind contact-making hole extending from the second surface of the circuit board to the first layer of the second group;
a third blind contact-making hole extending from the first surface of the circuit board to the second layer of the first group; and
a fourth blind contact-making hole extending from the second surface of the circuit board to the second layer of the second group;
wherein:
the one of the first conductor tracks runs from the one of the first contact terminals through the first blind contact-making hole to the first layer of the first group, and the one of the second conductor tracks runs from the one of the second contact terminals through the second blind contact-making hole to the first layer of the second group; and
the other of the first conductor tracks runs from the other of the first contact terminals through the third blind contact-making hole to the second layer of the first group, and the other of the second conductor tracks runs from the other of the second contact terminals through the fourth blind contact-making hole to the second layer of the second group.

8. The circuit board of claim 7, further comprising:
a fifth blind contact-making hole extending from one of the layers of the first group to the first surface of the circuit board; and
a fifth continuous contact-making hole extending from the first surface to the second surface of the circuit board;

wherein:
the first conductor tracks run from the one of the layers of the first group through the fifth blind contact-making hole to the semiconductor control component; and
the second conductor tracks run from one of the layers of the second group through the fifth continuous contact-making hole to the semiconductor control component.

9. The circuit board of claim 1, further comprising:
a plurality of semiconductor memory components arranged on the semiconductor board, wherein the semiconductor control component controls read and write accesses to the semiconductor memory components.

10. The circuit board of claim 9, wherein each of the semiconductor memory components includes a memory chip with dynamic random access memory cells.

11. The circuit board of claim 1, wherein the semiconductor control component includes a hub chip.

12. The circuit board of claim 11, wherein the hub chip of the semiconductor control component is located in a ball grid array housing.

13. The circuit board of claim 1, wherein the circuit board is formed as a fully buffered dual in-line memory circuit board.

* * * * *